United States Patent
Gluschenkov et al.

(10) Patent No.: US 11,562,906 B2
(45) Date of Patent: Jan. 24, 2023

(54) LOW RESISTANCE SOURCE DRAIN CONTACT FORMATION WITH TRENCH METASTABLE ALLOYS AND LASER ANNEALING

(71) Applicants: International Business Machines Corporation, Armonk, NY (US); GLOBALFOUNDRIES Inc.

(72) Inventors: Oleg Gluschenkov, Tannersville, NY (US); Zuoguang Liu, Schenectady, NY (US); Shogo Mochizuki, Clifton Park, NY (US); Hiroaki Niimi, Cohoes, NY (US); Tenko Yamashita, Schenectady, NY (US); Chun-Chen Yeh, Clifton Park, NY (US)

(73) Assignees: International Business Machines Corporation, Armonk, NY (US); GLOBALFOUNDRIES Inc., Grand Cayman (KY)

( * ) Notice: Subject to any disclaimer, the term of this patent is extended or adjusted under 35 U.S.C. 154(b) by 61 days.

(21) Appl. No.: 16/265,784

(22) Filed: Feb. 1, 2019

(65) Prior Publication Data
US 2019/0181012 A1    Jun. 13, 2019

Related U.S. Application Data

(62) Division of application No. 15/004,751, filed on Jan. 22, 2016, now Pat. No. 10,249,502.

(51) Int. Cl.
*H01L 21/285* (2006.01)
*H01L 29/08* (2006.01)
(Continued)

(52) U.S. Cl.
CPC .. *H01L 21/28518* (2013.01); *H01L 21/28525* (2013.01); *H01L 21/76814* (2013.01);
(Continued)

(58) Field of Classification Search
CPC ......... H01L 21/28518; H01L 21/28525; H01L 21/76814; H01L 21/76897;
(Continued)

(56) References Cited

U.S. PATENT DOCUMENTS

| | | | |
|---|---|---|---|
| 5,723,382 A | 3/1998 | Sandhu et al. | |
| 6,906,383 B1 | 6/2005 | Zhang et al. | |

(Continued)

OTHER PUBLICATIONS

F.A. Trumbore, "Solid solubilities of impurity elements in germanium and silicon," Bell Syst. Tech. J., 39, pp. 205-233 (1960).
(Continued)

*Primary Examiner* — Lex H Malsawma
*Assistant Examiner* — Eric W Jones
(74) *Attorney, Agent, or Firm* — Robert Sullivan; Michael J. Chang, LLC

(57) ABSTRACT

Techniques for forming a metastable phosphorous P-doped silicon Si source drain contacts are provided. In one aspect, a method for forming n-type source and drain contacts includes the steps of: forming a transistor on a substrate; depositing a dielectric over the transistor; forming contact trenches in the dielectric that extend down to source and drain regions of the transistor; forming an epitaxial material in the contact trenches on the source and drain regions; implanting P into the epitaxial material to form an amorphous P-doped layer; and annealing the amorphous P-doped layer under conditions sufficient to form a crystalline P-doped layer having a homogenous phosphorous concentration that is greater than about $1.5 \times 10^{21}$ atoms per cubic centimeter (at./cm$^3$). Transistor devices are also provided utilizing the present P-doped Si source and drain contacts.

20 Claims, 8 Drawing Sheets

(51) Int. Cl.
*H01L 29/24* (2006.01)
*H01L 29/267* (2006.01)
*H01L 29/78* (2006.01)
*H01L 29/66* (2006.01)
*H01L 21/768* (2006.01)

(52) U.S. Cl.
CPC .... *H01L 21/76897* (2013.01); *H01L 29/0847* (2013.01); *H01L 29/24* (2013.01); *H01L 29/267* (2013.01); *H01L 29/66636* (2013.01); *H01L 29/66795* (2013.01); *H01L 29/7848* (2013.01); *H01L 29/7851* (2013.01); *H01L 21/76843* (2013.01); *H01L 21/76855* (2013.01)

(58) Field of Classification Search
CPC ......... H01L 21/76843; H01L 21/76855; H01L 29/24; H01L 29/267; H01L 29/66636; H01L 29/66795; H01L 29/7848; H01L 29/7851
USPC .......................................... 257/194; 438/197
See application file for complete search history.

(56) References Cited

U.S. PATENT DOCUMENTS

| | | | |
|---|---|---|---|
| 7,425,500 | B2 | 9/2008 | Metz et al. |
| 8,803,245 | B2 | 8/2014 | Sell et al. |
| 8,999,779 | B2 | 4/2015 | Naczas et al. |
| 9,059,096 | B2 | 6/2015 | Guillorn et al. |
| 9,105,614 | B2 | 8/2015 | Sardesai |
| 9,337,339 | B1 | 5/2016 | Lee et al. |
| 2003/0230811 | A1 | 12/2003 | Kim |
| 2005/0287799 | A1 | 12/2005 | Lee et al. |
| 2010/0052166 | A1 | 3/2010 | Mukherjee et al. |
| 2011/0241084 | A1 | 10/2011 | Wu et al. |
| 2012/0094448 | A1 | 4/2012 | Yeh et al. |
| 2012/0305995 | A1 | 12/2012 | Javorka et al. |
| 2013/0023094 | A1 | 1/2013 | Yeh et al. |
| 2013/0154026 | A1* | 6/2013 | Alptekin ......... H01L 21/823871 257/384 |
| 2013/0157431 | A1 | 6/2013 | Tsai et al. |
| 2013/0228862 | A1 | 9/2013 | Lee et al. |
| 2013/0328126 | A1 | 12/2013 | Tsai et al. |
| 2014/0106523 | A1* | 4/2014 | Koldiaev ............. H01L 27/088 438/212 |
| 2014/0199837 | A1* | 7/2014 | Hung .................. H01L 23/485 438/675 |
| 2014/0252412 | A1* | 9/2014 | Tsai .................. H01L 21/02576 257/192 |
| 2014/0252424 | A1* | 9/2014 | Cai ................. H01L 21/823864 257/288 |
| 2014/0346575 | A1 | 11/2014 | Chen et al. |
| 2014/0353731 | A1 | 12/2014 | Colinge et al. |
| 2015/0021697 | A1 | 1/2015 | Colinge et al. |
| 2015/0102422 | A1 | 4/2015 | Cai et al. |
| 2015/0270342 | A1 | 9/2015 | Tsai et al. |
| 2016/0043035 | A1 | 2/2016 | Lin et al. |
| 2016/0163797 | A1 | 6/2016 | Shen et al. |
| 2016/0190133 | A1 | 6/2016 | Wu et al. |
| 2016/0284601 | A1 | 9/2016 | Yu et al. |

OTHER PUBLICATIONS

V.E. Borisenko et al., "Steady-state solubility of substitutional impurities in silicon," Phys. Status Solidi, A 101, p. 123 (May 1987).

Sohn et al., "Analytic model of S/D series resistance in trigate FinFETs with polygonal epitaxy," IEEE Transactions on Electron Devices, vol. 60, No. 4, Apr. 2013, pp. 1302-1309.

List of IBM Patents or Applications Treated as Related (2 pages), 2019.

* cited by examiner

LOW RESISTANCE SOURCE DRAIN CONTACT FORMATION WITH TRENCH METASTABLE ALLOYS AND LASER ANNEALING

CROSS-REFERENCE TO RELATED APPLICATIONS

This application is a divisional of U.S. application Ser. No. 15/004,751 filed on Jan. 22, 2016, now U.S. Pat. No. 10,249,502, the contents of which are incorporated by reference herein.

FIELD OF THE INVENTION

The present invention relates to low resistance source drain contacts in complementary metal-oxide semiconductor (CMOS) devices, and more particularly, to techniques for forming a metastable phosphorous (P)-doped silicon (Si) source drain n-type contacts using a pocketed ion implant amorphization followed by a solid or liquid phase epitaxial re-growth using laser annealing.

BACKGROUND OF THE INVENTION

CMOS transistors generally include source and drain regions interconnected by a channel region, and at least one gate that regulates current flow through the channel region. Contacts to the source and drain regions are often made by forming a metal silicide on the base source drain material, then depositing a dielectric over the transistor, patterning contact trenches in the dielectric, and lastly forming metal source drain contacts in the contact trenches.

The contact resistance between the metal contacts and the source drain material is an important consideration, especially with devices have scaled dimensions. Namely, as the contact area becomes increasingly smaller, contact resistance becomes a greater concern. Dopant implantation can be used to reduce the contact resistance. Phosphorous is a common dopant for n-type transistors. However, with conventional processes, the amount of phosphorous that can be used is limited by its chemical solubility.

Accordingly, techniques for reducing resistivity in source and drain contacts would be desirable.

SUMMARY OF THE INVENTION

The present invention provides techniques for forming a metastable phosphorous (P)-doped silicon (Si) source drain contacts using an ion implant amorphization followed by a solid or liquid phase epitaxial re-growth using laser annealing. In one aspect of the invention, a method for forming n-type source and drain contacts is provided. The method includes the steps of: forming a transistor on a substrate, the transistor having at least one gate stack and source and drain regions on opposite sides of the gate stack; depositing a dielectric over the transistor; forming contact trenches in the dielectric that extend down to the source and drain regions; forming an epitaxial material in the contact trenches on the source and drain regions; implanting phosphorous into the epitaxial material to form an amorphous phosphorous-doped layer; and annealing the amorphous phosphorous-doped layer under conditions sufficient to form a crystalline phosphorous-doped layer having a homogenous phosphorous concentration that is greater than about $1.5 \times 10^{21}$ atoms per cubic centimeter (at./cm$^3$).

In another aspect of the invention, a device is provided. The device includes: an n-type transistor on a substrate, the transistor having at least one gate stack and source and drain regions on opposite sides of the gate stack; a dielectric over the transistor; contact trenches in the dielectric that extend down to the source and drain regions; an epitaxial material in the contact trenches on the source and drain regions; and a crystalline phosphorous-doped layer in the contact trenches on the epitaxial material, wherein the crystalline phosphorous-doped layer has a homogenous phosphorous concentration that is greater than about $1.5 \times 10^{21}$ at./cm$^3$.

In another aspect of the invention, another device is provided. The device includes: an n-type transistor on a substrate, the transistor having at least one gate stack and source and drain regions on opposite sides of the gate stack; a dielectric over the transistor; contact trenches in the dielectric that extend down to the source and drain regions; a metal silicide layer in the contact trenches on the source and drain regions, wherein the metal silicide layer has a homogenous phosphorous concentration that is greater than about $1.5 \times 10^{21}$ at./cm$^3$.

A more complete understanding of the present invention, as well as further features and advantages of the present invention, will be obtained by reference to the following detailed description and drawings.

DETAILED DESCRIPTION OF PREFERRED EMBODIMENTS

As provided above, with conventional processes use of n-type dopants such as phosphorous (P) to reduce contact resistivity is limited by its chemical solubility. For instance, the chemical solubility of phosphorous in crystalline silicon (Si) depends on temperature, but peaks at from about $1.2\times10^{21}$ atoms per cubic centimeter (at./cm$^3$) to about $1.5\times10^{21}$ at./cm$^3$. See, for example, F. A. Trumbore, "Solid solubilities of impurity elements in germanium and silicon," Bell Syst. Tech. J., 39, 205 (1960), the contents of which are incorporated by reference as if fully set forth herein. Importantly, the substitutional "active" phosphorus peaks at around $4\times10^{20}$ at./cm$^3$ at a temperature of from about 1100° C. to about 1200° C. See, for example, V. E. Borisenko et al., "Steady-state solubility of substitutional impurities in silicon," Phys. Status Solidi, A 101, 123 (1987), the contents of which are incorporated by reference as if fully set forth herein. Adding more phosphorous lowers the contact resistance. However, when simply adding phosphorous above the chemical solubility limit, the phosphorous will begin to form clusters and precipitates, resulting in a non-homogenous material. Precipitated or clusterized dopants do not contribute to electrical conduction.

Advantageously, by way of a rapid re-crystallization annealing process, the present techniques may be employed to increase the P content above the chemical solubility limit, while maintaining homogeneous Si:P material. This results in decreasing the contact resistance while generally adding dopant in excess of its chemical solubility limit does not improve resistivity and contact resistance. Namely, when creating a (semiconductor-dopant) alloy such as a SiP alloy, there is limit beyond which a chemically homogeneous material generally cannot be formed. Above this limit, the dopant tends to form precipitates and clusters. However, it has been found herein that an ion implant to first create a pocketed, amorphous Si:P layer, followed by a rapid re-crystallization annealing process can be used to increase the P active concentration significantly above the chemical solubility limit, without precipitate formation and with a positive effect onto contact resistance. Without being bound by any particular theory, it is thought that the present rapid annealing process serves to quickly re-crystallize the pocketed, small-volume amorphous material, such that it does not allow the atoms to move around enough to form clusters or precipitates that are thermodynamically-favored, thereby avoiding any precipitation from occurring. The present techniques may be used in conjunction with those described in U.S. patent application Ser. No. 15/004,756, entitled "Low Resistance Source Drain Contact Formation," the contents of which are incorporated by reference as if fully set forth herein.

Figure 1:
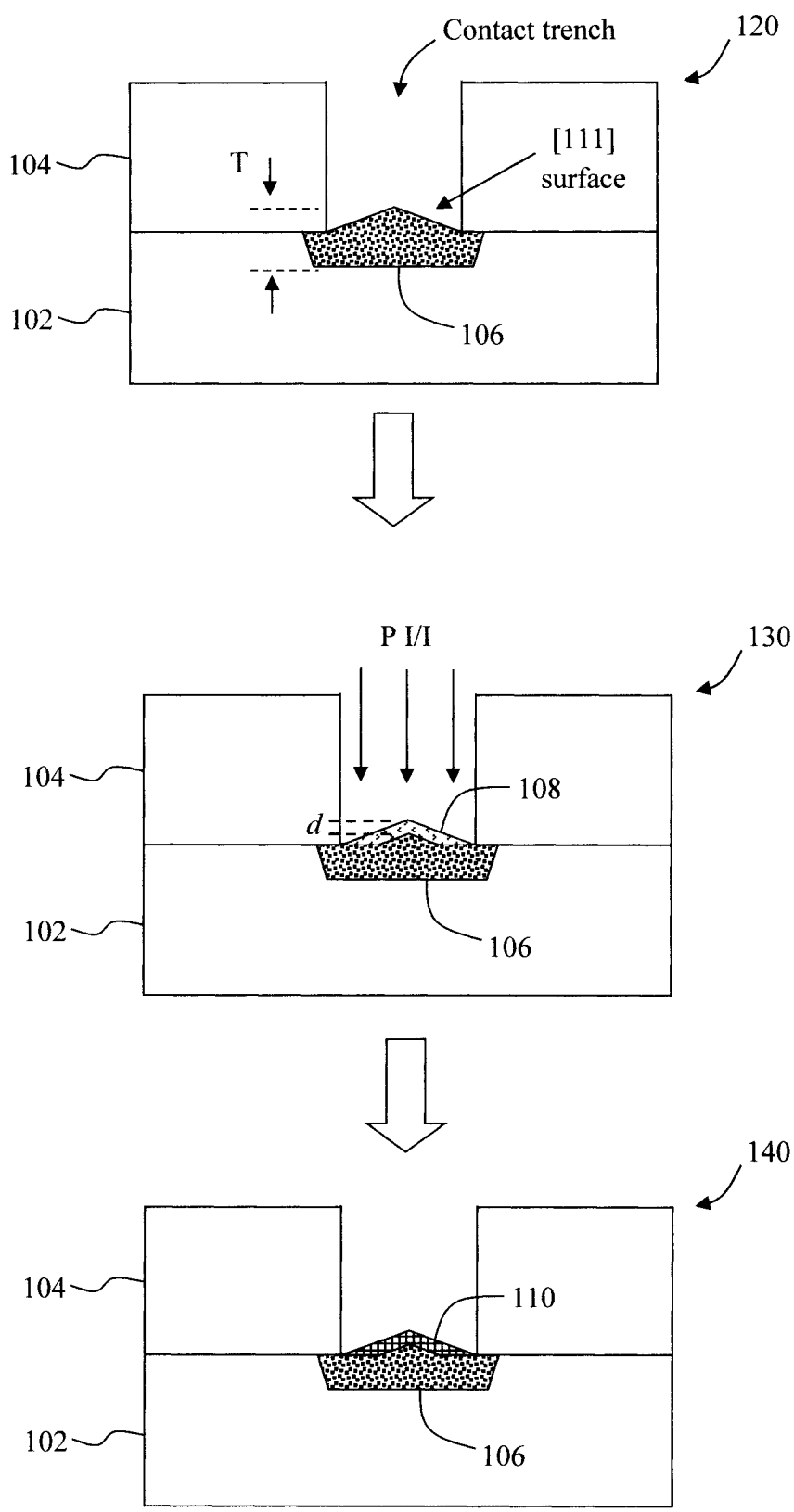
FIG. 1 is a cross-sectional diagram illustrating an exemplary methodology for forming a phosphorous-doped n-type source and drain contact having a raised hat epitaxial structure according to an embodiment of the present invention.

An overview of the present techniques for forming phosphorous-doped source and drain n-type contacts is provided in FIG. 1. To highlight the present techniques, FIG. 1 focuses on formation of the source and drain contacts. Examples depicting the complete transistor will be described below. Step 120 of FIG. 1 generally depicts a substrate 102 and a dielectric 104 on the substrate 102. The substrate 102 can have a number of different geometrical configurations and includes n-type transistor elements such as isolation, channel, gate stack, source/drain to be detailed below.

As shown in FIG. 1, a contact trench has been patterned in the dielectric 104. By way of example only, a reactive ion etching (RIE) process may be employed to form the contact trench in the dielectric 104. The size of the contact openings varies in accordance with the technology node and is typically less than 20 nanometers (nm) for technology nodes of 14 nm or less. It is to be understood that the small contact size results in a large semiconductor-metal contact resistance due to small current-crossing area while, on the other hand, progressively smaller contacts are required to enable smaller transistors and denser circuits. The semiconductor-metal contact will be created within the small trench opening. It was found herein that the small contact opening provides an advantage for further stabilizing metastable semiconductor-dopant alloys formed within.

Using a plasma etching process, such as RIE, leaves surface damage and polymeric residue. Thus, it is preferable, following the etch, to clean the exposed surfaces of the substrate 102 at the bottom of contact trenches. Suitable cleaning processes include, but are not limited to, a surface treatment with dry or wet with hydrofluoride (HF), nitrogen trifluoride (NF$_3$), hydrogen chloride (HCl), and mixtures thereof. Despite the cleaning process, some of the foreign atoms, namely, carbon and/or oxygen, from the residue may remain trapped at the surface and within the defects interfering with subsequent processing steps and electrical current conduction. We note that both RIE and surface post-cleaning may develop a faceted depression in the crystalline source/drain material 106. The crystalline surfaces of the depression may include [111]- and [113]-oriented facets.

Figure 1A:
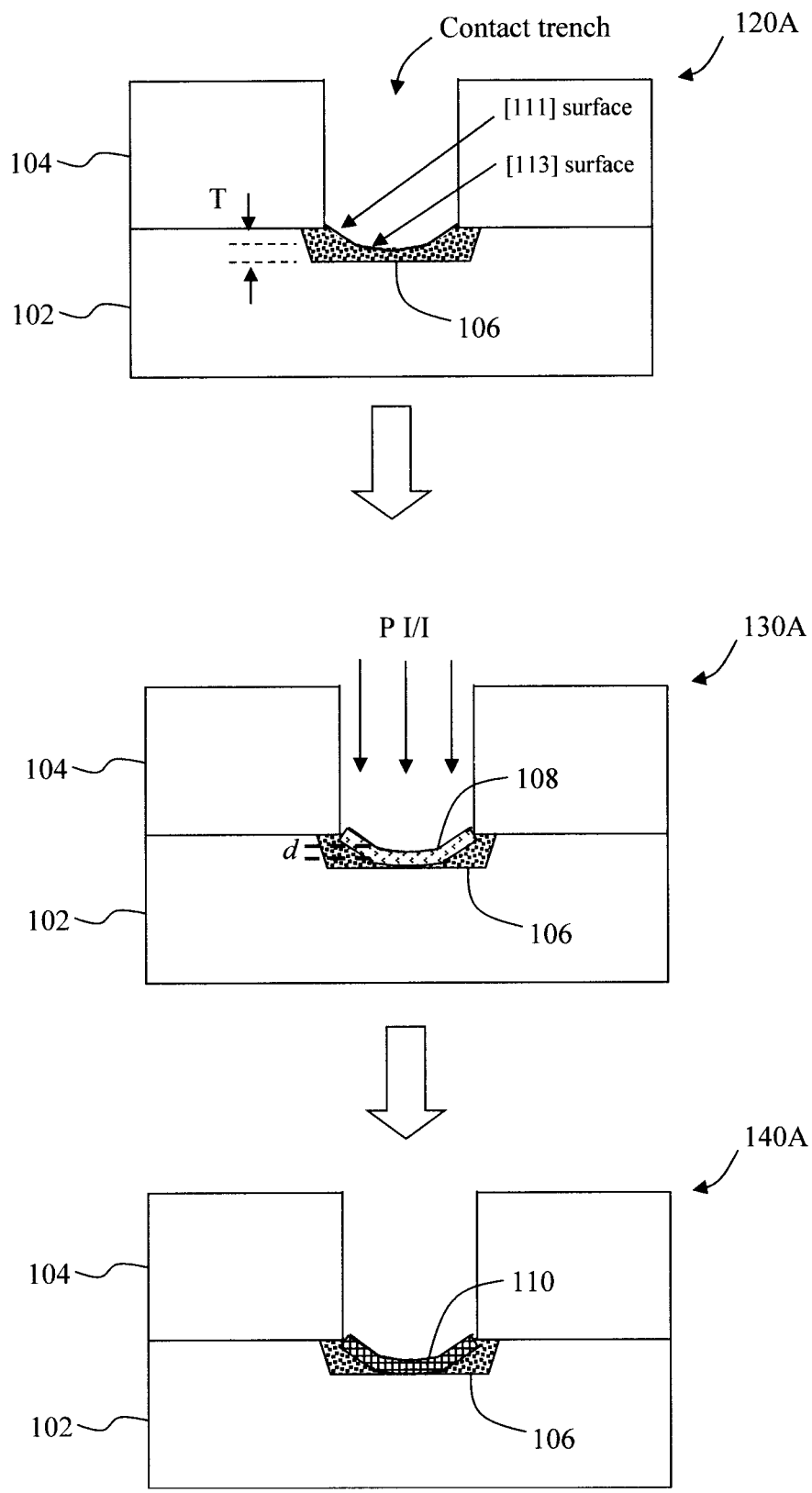
FIG. 1A is a cross-sectional diagram illustrating an exemplary methodology for forming a phosphorous-doped n-type source and drain contact having a depressed faceted epitaxial structure according to an embodiment of the present invention.

A trench epitaxial material 106 is then grown in the contact trench. According to an exemplary embodiment, the epitaxial material 106 is phosphorous (P)-doped silicon (i.e., Si:P). Doping may be carried out during the epitaxy (in-situ doping) or following the epitaxy via P ion implantation (ex-situ doping). Since this epitaxial growth occurs after the cleaning of the bottom of the contact trench, the interface between the substrate 102 and the epitaxial material 106 is clean and free of defects which serves to reduce the contact resistance. The purpose of this step is to reconstruct the damaged semiconductor surface creating a clean and ordered semiconducting material while locally adding extra phosphorous. The shape of the epitaxial material 106 depends on its target thickness T and its relationship to the trench opening. For thicknesses T substantially smaller than the trench opening, the layer 106 conformally grows on the crystalline facets of underlying source/drain material of substrate 102. As the epitaxial growth progresses, the epitaxial material 106 develops a raised 'hat' structure with [111]-oriented facets, as shown in FIG. 1. Advantageously, the top surface of epitaxial material 106 is maximized for lower contact resistance. As provided above, the RIE and surface postcleaning may develop a faceted depression in the crystalline source/drain material 106 with crystalline surfaces having [111]- and [113]-oriented facets. Thus, the epitaxial material 106 may also develop a depressed faceted structure with [111]- and [113]-oriented facets. See, e.g., FIG. 1A. FIG. 1A outlines the same general steps as in FIG. 1 (but designated as version A in FIG. 1A) in the case of a depressed faceted structure.

Accordingly, both depressed and raised "hat" faceted structures are preferred over a flat top surface. The depressed faceted structure of epitaxial material 106 for target thickness T of less than the trench opening and from about 5 nm to about 15 nm, and ranges therebetween, is preferred due to a small resultant volume and an increased surface area of material 106.

The preferred technique of growing exemplary epitaxial material 106 is a low-temperature chemical vapor deposition (CVD) with suitable Si precursors including but not limited to disilane $Si_2H_6$ and phosphorous precursors including but not limited to phosphine $PH_3$. By way of example only, the CVD growth conditions may include the deposition temperature of from about 400 degrees Celsius (° C.) to about 550° C., and ranges therebetween, wherein the upper temperature limit is set by the compatibility to the gate stack material present in the substrate 102. The concentration of chemical P in material 106 is from about $1 \times 10^{21}$ at./cm$^3$ (or 2 atomic percent, at. %) to about $6 \times 10^{21}$ at./cm$^3$ (or 12 atomic percent, at. %), and ranges therebetween, with the active concentration of P being from about $4 \times 10^{20}$ at./cm$^3$ to about $1 \times 10^{21}$ at./cm$^3$, and ranges therebetween. The excess P atoms in as-grown layer 106 forms clusters and do not contribute to electrical conduction.

As highlighted above, the present techniques will be employed to further increase the concentration of phosphorous in the contact structure and to make an alloy with increased concentration of free electrons. Namely, according to the present example, the epitaxial material 106 already includes Si:P. The task now is to increase the phosphorous concentration using an amorphizing, pocketed implant to introduce additional phosphorous into the epitaxial material 106 and to homogenize epitaxial material 106 amorphizing Si and breaking up existing phosphorous clusters, followed by a rapid laser anneal to re-crystallize the material. As is known in the art, an amorphization implant is used to intentionally destroy the ordered crystalline structure of the material into which the implant is being performed. As provided above, by performing the laser annealing very quickly (i.e., on the order of a few milli/nanoseconds—depending on the process employed, see below), a homogenous, metastable material can be formed within the small volume of the contact opening. For illustrative purposes only, a homogenous material in this context means absence of abrupt changes in concentration of its constituents, especially P, while allowing for gradual changes. Such homogenous material may be defined via comparing concentrations within small (e.g., 1 nm by 1 nm) adjacent cells of layer 110 (see description of step 140 below) such that P concentration difference between adjacent cells does not exceed 50%. The homogeneous property of layer 110 can be verified via a high-resolution transmission electron microscopy and related techniques.

Specifically, as shown in step 130, an amorphizing ion implant (I/I) of additional P is performed into the epitaxial material 106 forming a pocketed amorphous layer 108 in the epitaxial material 106 having a higher phosphorous concentration than the bulk of the epitaxial material 106. By way of example only, the epitaxial material 106 may contain P-doped Si having the formula $Si_{1-x}P_x$, and the amorphous layer 108 may contain P-doped Si having the formula $Si_{1-y}P_y$, wherein y>x>0, and wherein y>0.08. The implantation conditions are selected to achieve a target concentration of P atoms throughout the pocket 108, a target depth d of pocket 108, and reducing any undesirable ion straggle away from the contact opening. The depth d of pocket 108 is preferably from about 3 nm to about 15 nm, and ranges therebetween. By way of example only, the P ion implantation conditions may include zero ion tilt (vertical implant), ion energy from about 0.2 kilo-electron volts (keV) to about 5 keV and ranges therebetween, an ion dose of from about $1 \times 10^{15}$ cm$^{-2}$ to about $1 \times 10^{16}$ cm$^{-2}$ and ranges therebetween, and a substrate implantation temperature of from about −150° C. (cryor implantations) to about 80° C., and ranges therebetween. The implant tooling can be a beamline type or a plasma doping type. If the material 106 has P content in excess of 10 at. %, the amorphizing implantation can be accomplished through any large, neutral ion including but not limited to silicon (Si), germanium (Ge), xenon (Xe), or argon (Ar) ions.

As shown in step 140, the amorphizing implantation will be followed by a rapid laser annealing process to re-crystallize the amorphous layer or pocket 108 forming crystalline layer 110. The anneal is performed so fast that it does not allow the P atoms to move around enough to form P clusters and precipitates that are thermodynamically-favored, thereby avoiding any precipitation and clusterization from occurring. As a result, a homogeneous Si:P material 110 can be formed even at phosphorous concentrations above that which are chemically stable. Therefore, phosphorous active concentrations exceeding the chemical solubility limits can be employed. Such homogeneous SiP alloy exhibits a metallic-type electrical conductivity of highly-degenerate n-type semiconductor with its Fermi level close to the conduction band of silicon. By way of example only, the crystalline layer 110 has a phosphorous concentration that is greater than about $1.5 \times 10^{21}$ at./cm$^3$, e.g., from about $4 \times 10^{21}$ at./cm$^3$ (or 8 at. %) to about $1 \times 10^{22}$ at./cm$^3$, (or 20 at. %), and ranges therebetween.

This anneal can be performed in number of different ways but needs to be compatible with the temperature sensitive structures, such as the gate stack, present in the substrate 102 at this step. For millisecond-scale anneals, the presence of gate stack in the substrate 102 limits the peak anneal temperature to about 950° C. while for a nanosecond-scale anneals, melting of crystalline semiconductors, typically silicon germanium SiGe present in the substrate 102, limits peak anneal temperature to about 1,300° C.

According to one exemplary embodiment, a solid phase epitaxy (SPE) laser annealing process is used to anneal the amorphous layer 108 at temperature of from about 800° C. to about 950° C., and ranges therebetween, for a duration of from about 50 microseconds to about 3 milliseconds, and ranges therebetween. A triangular temperature-time laser spike annealing process can be used for this purpose. The preferred peak temperature for laser spike anneal process is from about 800° C. to about 950° C., and ranges therebetween, and preferred duration at 50 degrees below peak temperature is from about 50 microseconds to about 250 microseconds, and ranges therebetween. This can be performed using a millisecond laser annealer. It was found herein that the P content in excess of 10 at. % in amorphous layer 108 speeds up SPE rate allowing for a full re-growth at below 950° C. while typically full re-growth is achieved at temperatures above about 1,100° C. This makes laser SPE process compatible with the gate stack structure. According to another exemplary embodiment, a liquid phase epitaxy (LPE) laser annealing process is used to anneal the amorphous layer 502 above its melting point at temperature of from about 1,200° C. to about 1,300° C., and ranges therebetween, for a duration of from about 10 nanoseconds to about 1,000 nanoseconds, and ranges therebetween. This can be performed using a nanosecond melt laser annealer. Advantageously, the nanosecond melt laser annealer may include a combination of millisecond laser annealing and nanosecond laser annealing. In this case, the LPE laser annealing is conducted with a millisecond-scale temperature ramping to an intermediate temperature of from about 600° C. to about 750° C., and ranges therebetween, with an overlaid nanosecond temperature spike to above the melting point of material 108. The SPE laser annealing has a slower rate of re-crystallization but does not allow any excessive movement of P atoms while LPE laser annealing has a faster rate of re-crystallization and allows for redistribution of atoms in the molten phase. Faster re-crystallization rates may allow for sustaining higher concentration of P without clusterization and precipitation. P atom redistribution in the molten phase may be advantageous to form a uniform concentration of P throughout the bulk of layer 110. Once the metastable alloy $Si_{1-y}P_y$, wherein y>0.08 is formed, it should be preserved by limiting the temperature and duration of subsequent processes. We note that while the metastable alloy is created late in the transistor processing sequence allowing for its preservation, the thermal budget of subsequent process steps shall be limited (discussed below).

Given the above overview of the processes employed in the present techniques to increase the source and drain contact dopant concentration, an exemplary implementation is now described by way of reference to FIGS. 2-12. This example begins with a transistor device having been formed on a substrate. For consistency with the description in FIG. 1, the substrate (and other like structures will be given the same reference numeral). Suitable substrates include, but are not limited to, bulk semiconductor substrates (e.g., bulk Si, germanium (Ge), silicon germanium (SiGe), III-V, etc. substrates), or semiconductor on insulator (SOI) substrates. As is known in the art, an SOI substrate includes a SOI layer (e.g., Si, Ge, SiGe, III-V, etc.) separated from a handle substrate (e.g., a Si substrate) by a buried insulator. When the buried insulator is an oxide, it is often referred to as a buried oxide. The substrate 102 is generally cut or shaped into isolated active area regions where individual transistors will be formed (not shown). While aspects of the exemplary embodiment are shown and described without specifying various shapes of the transistor active region and channel, it is to be understood that aspects of the present invention may be employed with different geometrical orientations and shapes of transistor active region or its channel such as a planar n-type field-effect transistor (nFET), FINFET, surround-gate FETs, multiple-gate FETs, nano-wire or nano-sheet FETs, and vertical FETs. In the present figures, substrate 102 is intended to generally represent any of these possible substrate configurations.

Figure 2:
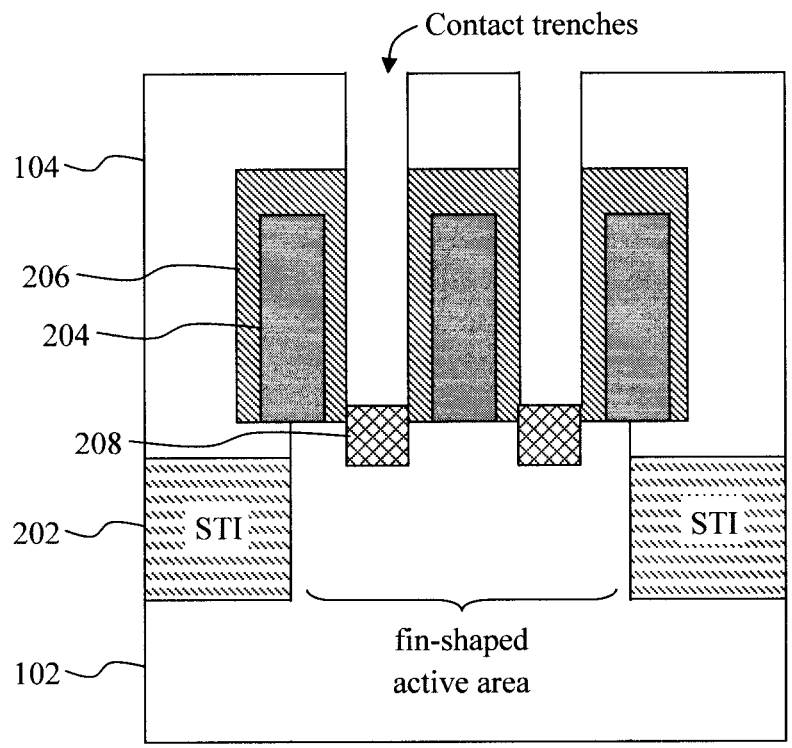
FIG. 2 is a cross-sectional diagram illustrating a transistor device having been formed on a substrate, the transistor device including gate stacks having been formed over an active area of the substrate, spacers and source and drain region epitaxy placed on opposite sides of the gate stacks, a dielectric having been deposited over the transistor device, and contact trenches having been formed in the dielectric which extend down to the source and drain region epitaxy according to an embodiment of the present invention.
Figure 3:
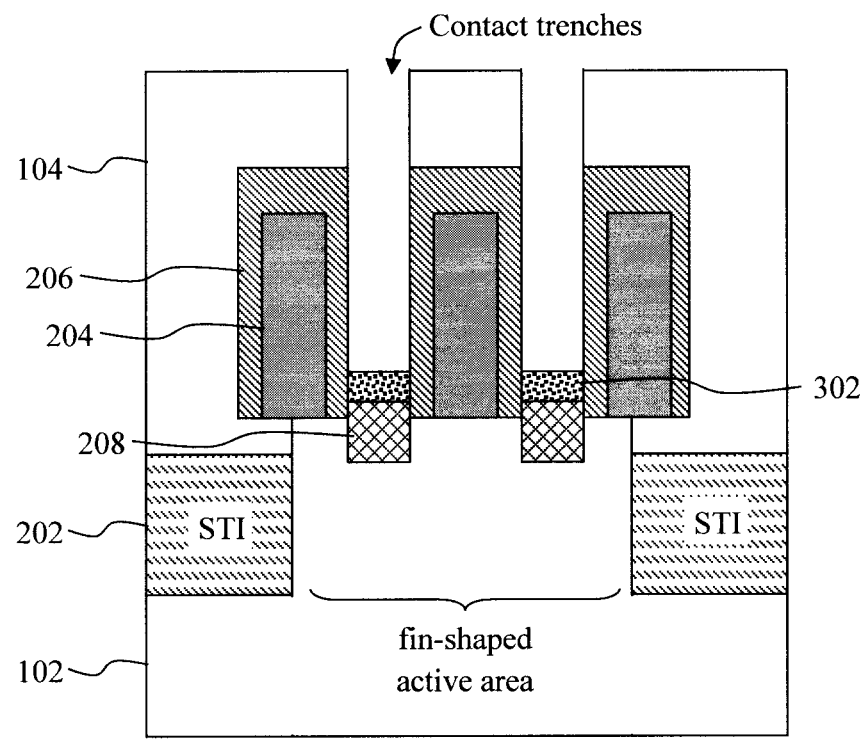
FIG. 3 is a cross-sectional diagram illustrating a trench epitaxial material having been formed in the contact trenches on the source and drain epitaxy according to an embodiment of the present invention.

As shown in FIG. 2, a standard shallow trench isolation or STI process has been employed to define at least one active area in the substrate 102. As is known in the art, STI involves patterning trenches in a substrate and then filling the trenches with a suitable insulator, such as an oxide. In the instant example, the active area is fin-shaped. However, this is merely an example.

As shown in FIG. 2, one or more gate stacks 204 have been formed over the active area, and spacers 206 and/or source and drain region epitaxy 208 have been formed on opposite sides of the gate stacks 204. The dielectric 104 is then deposited over and covering the transistor. The gate stacks 204 can be formed on the substrate 102 using a number of different processes. For instance, either a gate-first, or a gate-last process can be employed. With a gate-last approach, sacrificial (or dummy) gates (not shown) serve as placeholders for the final gate stacks 204. This permits the formation of the spacers 206 and/or source and drain region epitaxy 208 on opposite sides of the gate stacks 204. The dielectric 104 can be deposited around the dummy gates, which permits the dummy gates to be removed and replaced with the final gate stacks 204. Advantageously, the use of a gate-last approach avoids exposing the gate stacks 204 to potentially damaging processing conditions, such as elevated temperatures, since they are not placed until the end of the process. A suitable dummy gate material includes, but is not limited to, poly-silicon (poly-Si). By contrast, in a gate-first process, the gate stacks 204 are formed early on in the process, and spacers 206, source and drain region epitaxy 208, etc. are placed on opposite sides of the gate stacks 204.

Thus, the figures use gate stacks 204 to generically represent the gate stacks that can be formed using any of these suitable processes. While not specifically shown in the figures, according to an exemplary embodiment, each of the gate stacks 204 can include a gate dielectric and a gate conductor(s). As is generally known in the art, the gate dielectric separates the gate conductor(s) from the channel. Suitable gate conductors include, but are not limited to, doped poly-Si and/or a metal or combination of metals. The particular gate dielectric can vary depending on the gate conductor. For instance, silicon dioxide ($SiO_2$) is a suitable gate dielectric for a poly-Si gate, whereas hafnium oxide ($HfO_2$) or lanthanum oxide ($La_2O_3$) are suitable gate dielectrics for a metal gate. According to one exemplary embodiment, the gate is a metal gate, and the gate conductor is composed of a workfunction setting metal layer on the gate dielectric, and a filler gate metal layer on the workfunction setting metal layer. Suitable n-type workfunction setting metals include, but are not limited to, titanium nitride (TiN), titanium carbide (TiC), and tantalum nitride (TaN). Suitable p-type workfunction setting metals include, but are not limited to, TiN, titanium aluminum (TiAl), and tungsten (W). Suitable filler gate metals include, but are not limited to, tungsten (W), cobalt (Co), copper (Cu), aluminum (Al) and alloys thereof.

Once the permanent gate stack is formed, it limits the temperature of subsequent thermal steps, as alluded above. According to an exemplary embodiment, these limitations are: for minute- and second-scale processes the temperature shall not exceed 500° C., for millisecond-scale processes the temperature shall not exceed 950° C., for nanosecond-scale processes the temperature shall not exceed 1,300° C.

The next phase involves forming the source and drain contacts. To form the source and drain contacts, contact trenches are formed in the dielectric 104 between the gate stacks 204. As shown in FIG. 2, the contact trenches extend down to the source and drain region epitaxy 208. As provided above, an etch such as RIE is a suitable process for forming the contact trenches. Patterning the dielectric 104 relative to the gate stacks 204 and spacers 206 result in the contact trenches being self-aligned to the gate stacks 204. The size of the contact openings is from about 20 nm to about 14 nm, and ranges therebetween for this exemplary embodiment. As provided above, a post-etch clean is preferably employed to remove plasma surface damage from the trench etch. According to an exemplary embodiment, the source and drain epitaxy 208 includes (in-situ or ex-situ) phosphorous-doped Si, i.e., Si:P.

A trench epitaxial material 302 is next formed (in the contact trenches) on the source and drain epitaxy 208 using a low-temperature epitaxy (from about 400° C. to about 500° C., and ranges therebetween) to be compatible with the gate stack limitation. See FIG. 3. Like the source and drain epitaxy 208, the trench epitaxial material 302 may also include (in-situ or ex-situ) phosphorous-doped Si, i.e., Si:P. However, by way of the present techniques (as described above) a combination of amorphizing P implantation and laser SPE or laser LPE will be used to increase the phosphorous active concentration in the source and drain contacts. Further, the temperature range of laser SPE or laser LPE processes are made compatible with the gate stack limitations.

Figure 4:
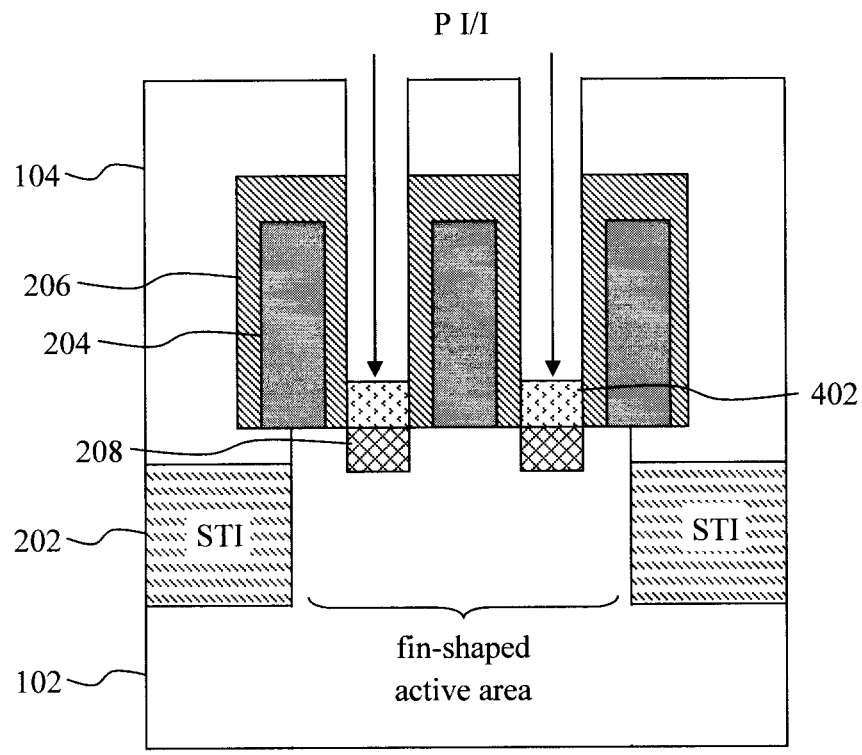
FIG. 4 is a cross-sectional diagram illustrating a pre-amorphization implantation (PAI) having been used to implant additional phosphorous into the trench epitaxial material forming an amorphous (Si:P) layer according to an embodiment of the present invention.
Figure 5:
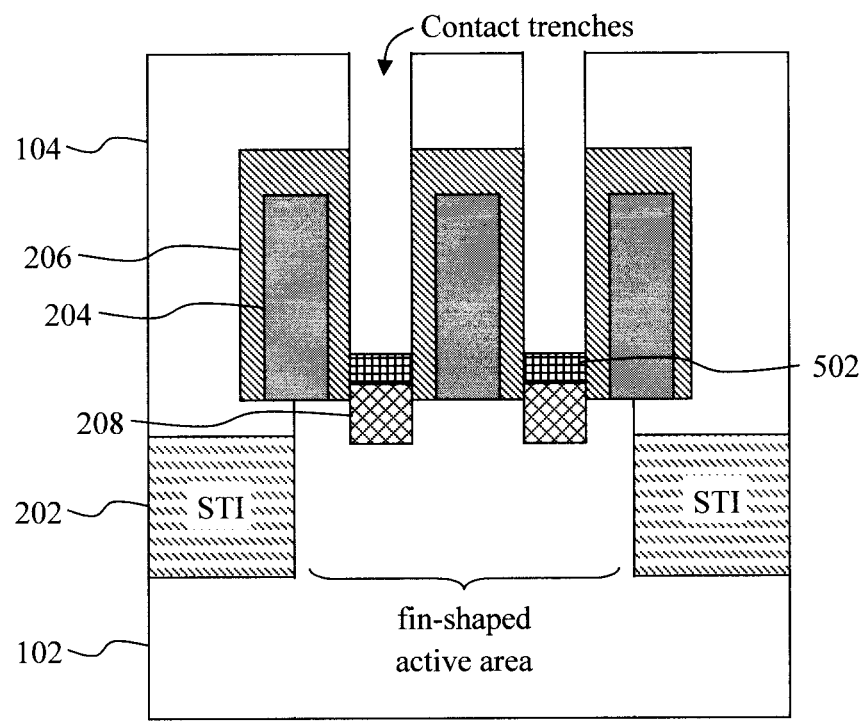
FIG. 5 is a cross-sectional diagram illustrating a solid phase or liquid phase rapid laser annealing process having been used to re-crystallize the amorphous layer, forming a crystalline Si:P layer according to an embodiment of the present invention.

Namely, as shown in FIG. 4, an amorphizing implant is used to implant additional phosphorous into the trench epitaxial material 302 forming an amorphous layer 402. The amorphous layer 402 will preferably have a greater phosphorous concentration than the trench epitaxial material 302. For instance, the trench epitaxial material 302 may have a phosphorous concentration of less than about $4 \times 10^{21}$ at./cm$^3$, whereas post-implant the amorphous layer 402 has a phosphorous concentration from about $4 \times 10^{21}$ at./cm$^3$ (or 8 at. %) to about $1 \times 10^{22}$ at./cm$^3$ (or 20 at. %) and ranges therebetween.

In the same manner as described above, a SPE or LPE rapid laser annealing process is used to melt and re-crystallize the amorphous layer 402 to form a metastable crystalline Si:P source and drain contact layer with active phosphorous concentration in the excess of chemical solubility limit of $1.5 \times 10^{21}$ at./cm$^3$ (or 3 at. %) and above about $4 \times 10^{21}$ at./cm$^3$ (or 8 at. %). This laser annealing step can be carried out at this stage in the process (as is the case in the present example), or alternatively, following liner and metal gap fill—see below.

Namely, in the present example, a SPE or LPE rapid laser annealing process can be next used to re-crystallize the amorphous layer 402, forming a crystalline Si:P layer 502. See FIG. 5. The parameters for this laser annealing step were provided above and are compatible with the gate stack limitations. As also provided above, the anneal is performed for such a short duration that the phosphorous dopant atoms are not permitted to form clusters or precipitates. As a result, a metastable, high phosphorous active concentration (i.e., exceeding chemical solubility limits) homogenous crystalline Si:P layer 502 can be formed. Such homogeneous SiP alloy exhibits a metallic-type electrical conductivity of highly-degenerate n-type semiconductor with its Fermi level close to the conduction band of silicon. By way of example only, the Si:P layer 502 can have an active phosphorous concentration of greater than about $1.5 \times 10^{21}$ at./cm$^3$, e.g., from about $2 \times 10^{21}$ at./cm$^3$ (or 4 at. %) to about $8 \times 10^{21}$ at./cm$^3$ (or 16 at. %) and ranges therebetween.

Figure 6:
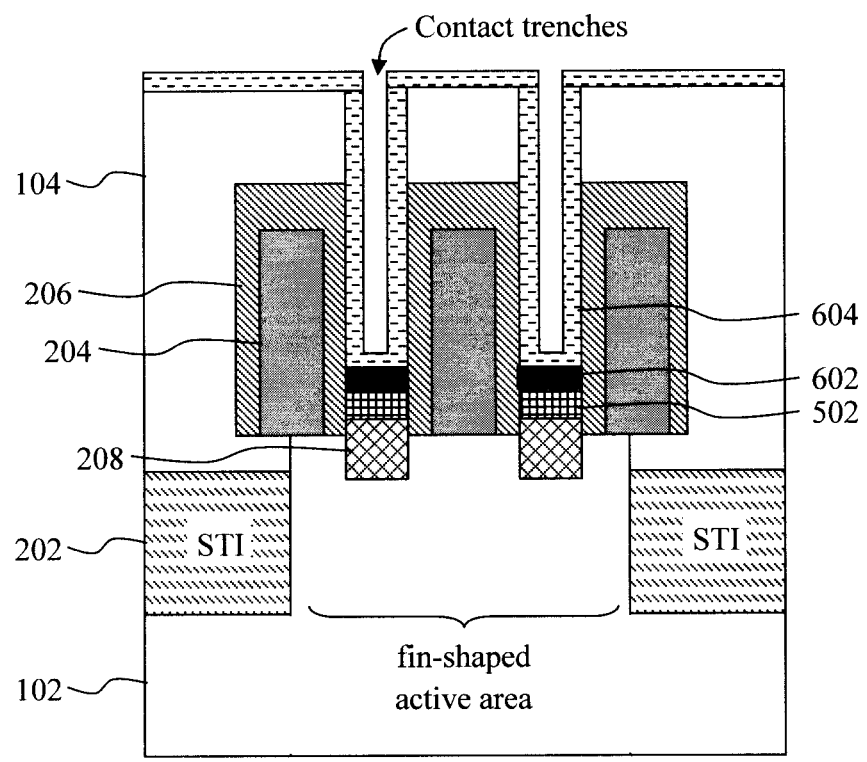
FIG. 6 is a cross-sectional diagram illustrating a bilayer (e.g., titanium/titanium nitride) liner having been formed in the contact trenches according to an embodiment of the present invention.
Figure 7:
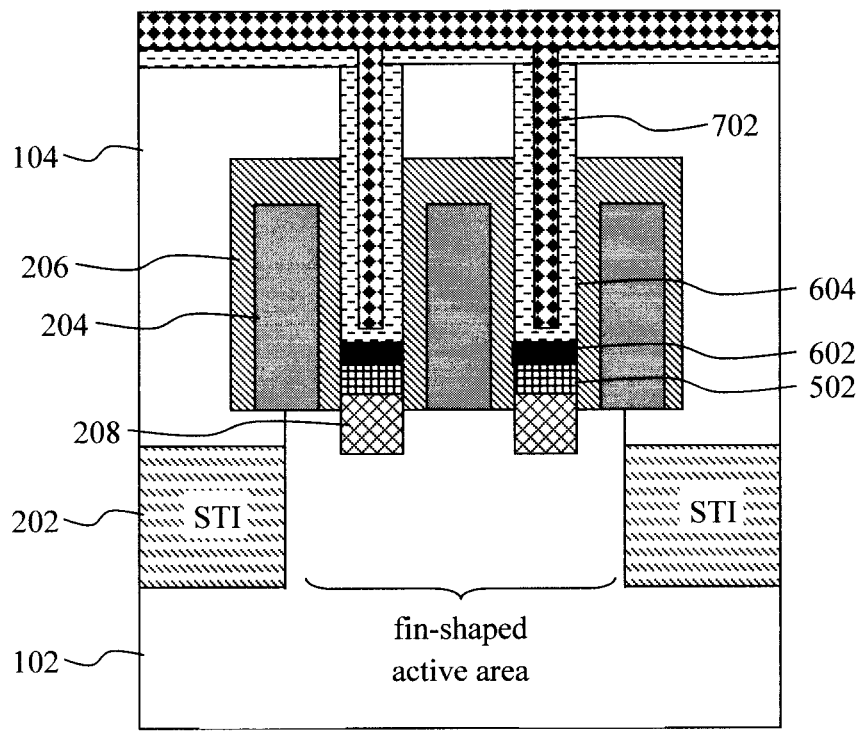
FIG. 7 is a cross-sectional diagram illustrating a gap fill metal having been used to fill the contact trenches according to an embodiment of the present invention.
Figure 8:
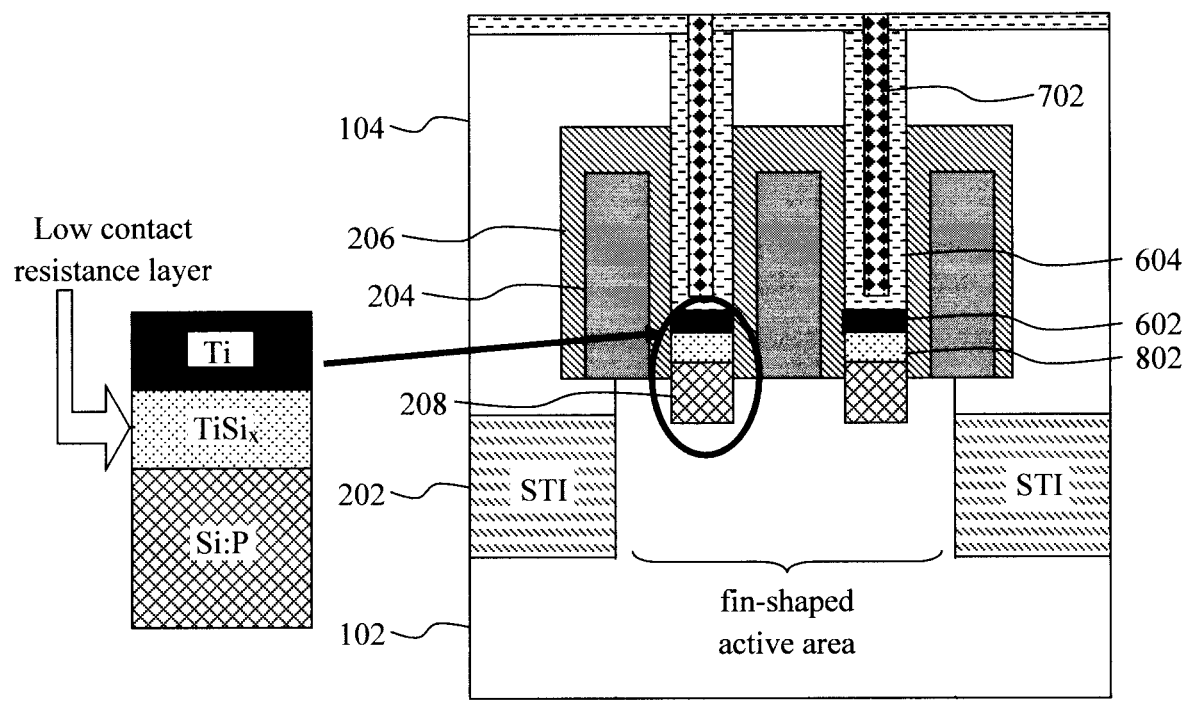
FIG. 8 is a cross-sectional diagram illustrating overfill gap fill metal having been removed using a process such as chemical-mechanical polishing (CMP), followed by an anneal to form a metal silicide layer in the contact according to an embodiment of the present invention.
Figure 9:
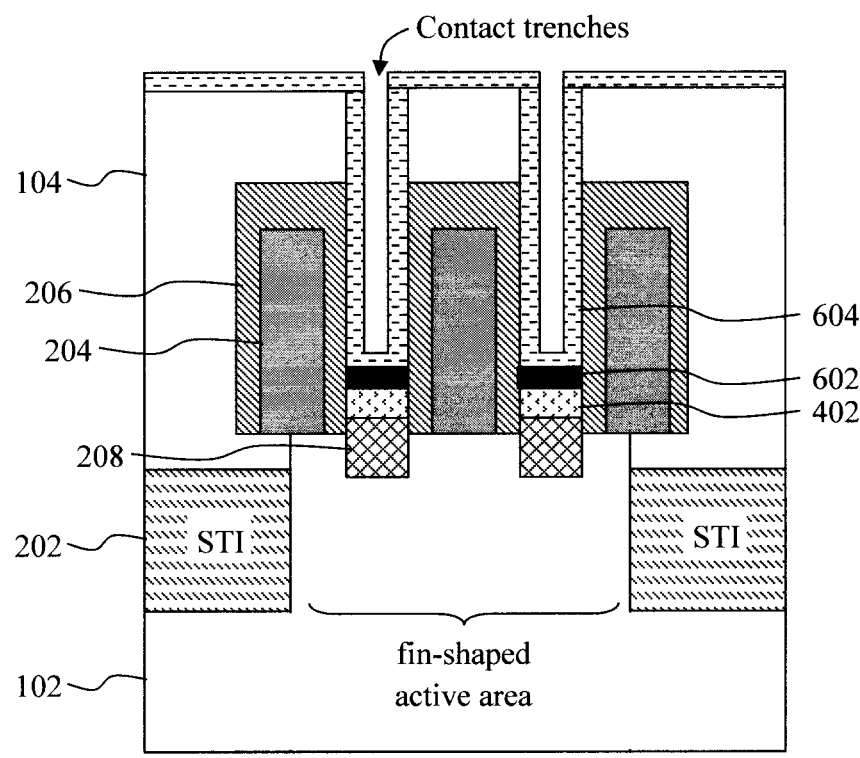
FIG. 9 is a cross-sectional diagram which follows from FIG. 4 illustrating, alternatively, the bilayer liner having been formed in the contact trenches over the amorphous layer according to an embodiment of the present invention.
Figure 10:
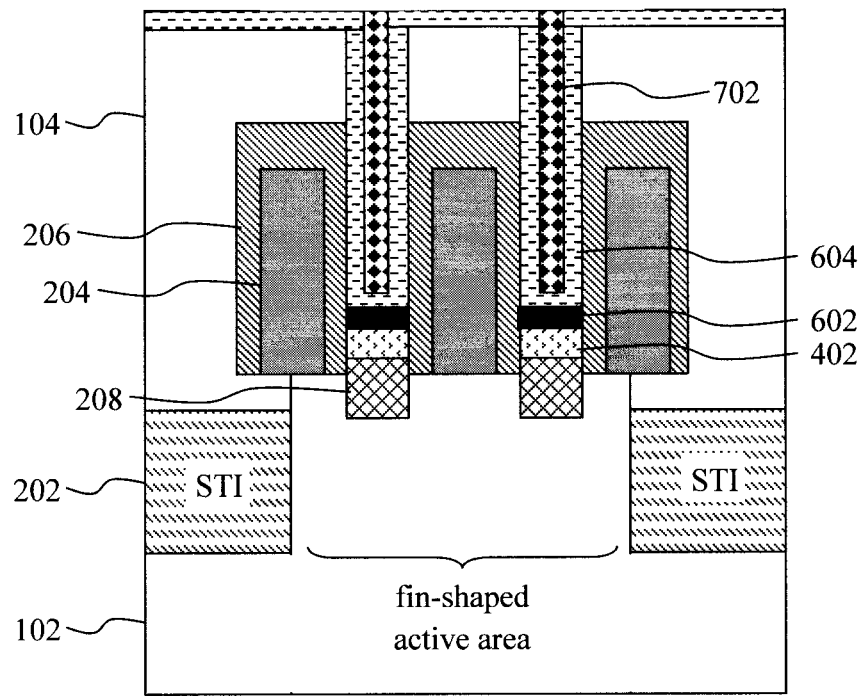
FIG. 10 is a cross-sectional diagram which follows from FIG. 9 illustrating the gap fill metal having been deposited onto the bilayer liner and polished (e.g., using CMP) according to an embodiment of the present invention.
Figure 11:
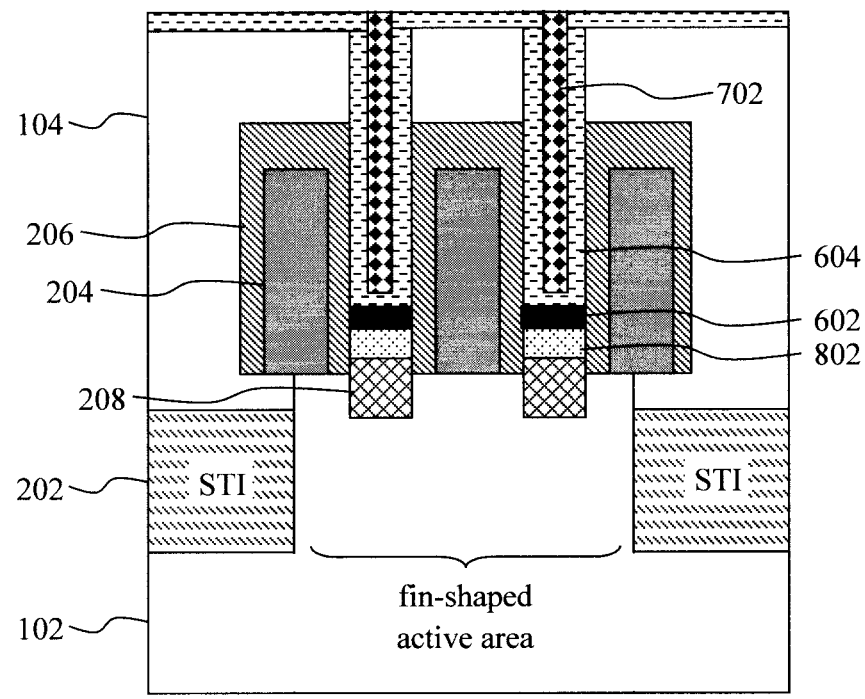
FIG. 11 is a cross-sectional diagram which follows from FIG. 10 illustrating a solid phase or liquid phase rapid laser annealing process having been used to re-crystallize the amorphous layer, and to form a metal silicide layer in the contact according to an embodiment of the present invention.

The source and drain contact structure can then be completed by first depositing a liner (FIG. 6), followed by gap fill metal (FIG. 7), polishing and reacting the liner with the Si:P layer 502 to form a silicide (FIG. 8). Specifically, as shown in FIG. 6, a bilayer (e.g., titanium (Ti)/titanium nitride (TiN)) liner is formed in the contact trenches. The liner includes a Ti layer 602 on the Si:P layer 502, and a conformal TiN layer 604 lining the bottom (i.e., on the Ti layer 602) and sidewalls of the contact trenches. An optional silicidation anneal can be performed at this step. According to an exemplary embodiment, this anneal is performed at a temperature of from about 750° C. to about 850° C., and ranges therebetween, for a duration of from about 50 microseconds to about 250 microseconds, and ranges therebetween A gap fill metal 702 is then used to fill the contact trenches. See FIG. 7. Suitable gap fill metals include, but are not limited to, tungsten (W) and/or cobalt (Co). Overfill gap fill metal 702 can be removed using a process such as chemical-mechanical polishing (CMP). See FIG. 8. In the example shown in FIG. 8, the TiN layer 604 acts as an etch stop for the polishing. Following the CMP an anneal is performed to react the Ti layer 602 of the metal liner with the crystalline Si:P layer 502 to form a silicide layer (TiSi$_x$) 802 having a low contact resistance (see, for example, FIG. 12, below). Namely, the silicide layer (TiSi$_x$) 802 will have a high phosphorous content based on the phosphorous content of crystalline Si:P layer 502 (see above). According to an exemplary embodiment, this anneal is performed at a temperature of from about 750° C. to about 850° C., and ranges therebetween, for a duration of from about 50 microseconds to about 250 microseconds, and ranges therebetween. The term "silicide," as used herein, generally refers to the product of a metal and semiconductor reaction, even if the semiconductor is not per se Si.

Alternatively, as provided above, the SPE or LPE rapid laser annealing process can instead be performed after the metallic liner deposition or after gap fill metal CMP combining laser SPE/LPE with the silicidation anneal. For instance, following from use of the amorphizing P ion implant to form the amorphous layer 402 as shown in FIG. 4, the above-described bilayer liner (e.g., Ti layer 602/TiN layer 604) can be formed in the contact trenches over the amorphous layer 402 (see FIG. 9), followed by the above-described gap metal fill, and CMP (see FIG. 10). Following the liner and gap metal fill processing, the above-described SPE or LPE laser annealing process can be performed to re-crystallize the amorphous layer 402 (forming crystalline Si:P), and simultaneously reacting the crystalline Si:P with the Ti layer 602 in the metal liner to form the silicide layer (TiSi$_x$) 802. See FIG. 11.

Figure 12:
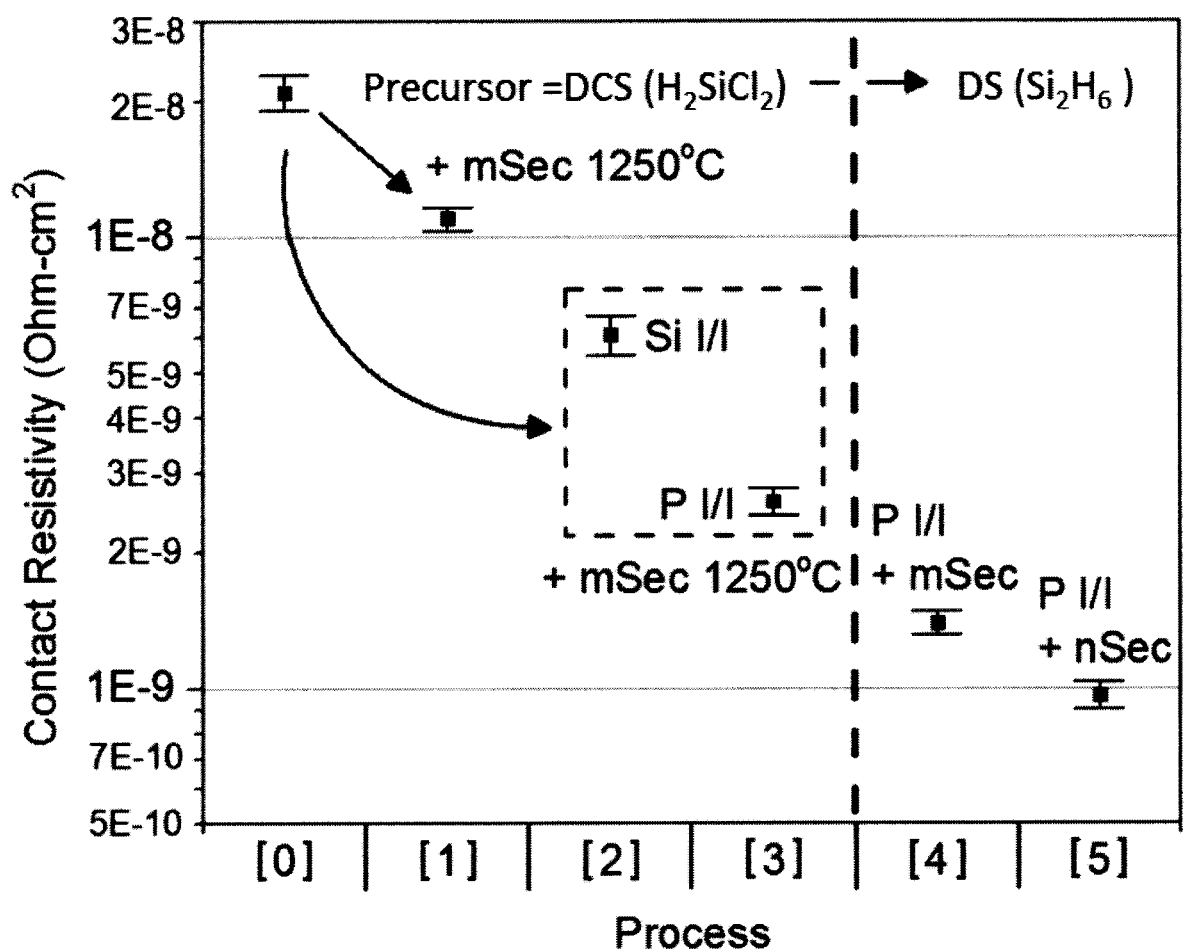
FIG. 12 is a diagram illustrating contact resistivity of samples prepared using with the present techniques according to an embodiment of the present invention.

The present techniques are further illustrated by way of reference to the following non-limiting example. The contact resistivity results for a sample prepared according to the present techniques are given in FIG. 12. As shown in FIG. 12, Case (0) shows the contact resistivity for a contact with the trench epitaxial material 302 only. Case (1) shows the contact resistivity for a contact with the trench epitaxial material 302 subjected to a millisecond laser anneal at 1,250° C. (prior art). Case (2) shows the contact resistivity for a contact with the trench epitaxial material 302 subjected to an amorphizing silicon ion implant and millisecond laser anneal at 1250° C. Case (3) shows the contact resistivity for a contact with the trench epitaxial material 302 subjected to an amorphizing P ion implant and millisecond laser anneal at 1,250° C. The epitaxial material 302 of Cases (0)-(3) is grown using dichlorosilane DCS at a temperature above about 700° C. leading to an in-situ phosphorus concentration in material 302 of below about $1 \times 10^{21}$ at./cm$^3$ (or 2 at. %).

The amorphizing P implant in Case (3) added about $2 \times 10^{21}$ at./cm$^3$ (or 4 at. %) to the in-situ phosphorus. Cases (0)-(3) are not compatible with the gate stack temperature limitations. The epitaxial material 302 of Cases (4) and (5) is grown using disilane DS at temperature about 450° C. leading to an in-situ phosphorus concentration in material 302 of about $4 \times 10^{21}$ at./cm$^3$ (or 8 at. %). Case (4) shows the contact resistivity for a contact with the trench DS-based epitaxial material 302 subjected to an amorphizing P ion implant and millisecond laser anneal at about 800° C. Case (5) shows the contact resistivity for a contact with the trench DS-based epitaxial material 302 subjected to an amorphizing P ion implant and nanosecond melt laser anneal at about 1,250° C. The amorphizing P implant in Cases (4) and (5) added about $2 \times 10^{21}$ at./cm$^3$ (or 4 at. %) to the in-situ phosphorus. Cases (4) and (5) are compatible with the gate stack temperature limitations.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A device comprising:
   an n-type transistor on a substrate, the transistor comprising at least one gate stack, source and drain regions on opposite sides of the at least one gate stack, and spacers in continuous and direct physical contact with a top and opposing sidewalls of the at least one gate stack;
   a dielectric over the transistor, wherein the dielectric extends horizontally over the at least one gate stack and the spacers, and wherein the dielectric is present alongside and under a bottom of at least one of the spacers;
   contact trenches in the dielectric that extend down to the source and drain regions;
   an epitaxial material in the contact trenches on the source and drain regions; and
   a crystalline phosphorous-doped layer in the contact trenches on the epitaxial material, wherein the crystalline phosphorous-doped layer has a homogenous phosphorous concentration that is greater than about $1.5 \times 10^{21}$ at./cm$^3$, and wherein both the epitaxial material and the crystalline phosphorous-doped layer are present entirely within the contact trenches and are below a top of the at least one gate stack.

2. The device of claim 1, wherein the phosphorous concentration is from about $4 \times 10^{21}$ at./cm$^3$ to about $1 \times 10^{22}$ at./cm$^3$, and ranges therebetween.

3. The device of claim 1, wherein the epitaxial material comprises phosphorous doped silicon.

4. The device of claim 1, wherein the epitaxial material has a formula $Si_{1-x}P_x$.

5. The device of claim 1, further comprising:
   a metal liner lining the contact trenches, wherein the metal liner is in direct contact with both the dielectric and the spacers.

6. The device of claim 5, wherein the metal liner comprises:
   a titanium layer on the crystalline phosphorous-doped layer, wherein the titanium layer is present only at a bottom of the contact trenches; and
   a titanium nitride layer on the titanium layer, wherein the titanium nitride layer is present at the bottom and along sidewalls of the contact trenches.

7. The device of claim 5, further comprising:
   a gap fill metal filling the contact trenches over the metal liner.

8. The device of claim 7, wherein the gap fill metal comprises a metal selected from the group consisting of tungsten, cobalt, and combinations thereof.

9. A device comprising:
   an n-type transistor on a substrate, the transistor comprising at least one gate stack, source and drain regions on opposite sides of the at least one gate stack, and spacers in continuous and direct physical contact with a top and opposing sidewalls of the at least one gate stack;
   a dielectric over the transistor, wherein the dielectric extends horizontally over the at least one gate stack and the spacers, and wherein the dielectric is present alongside and under a bottom of at least one of the spacers;
   contact trenches in the dielectric that extend down to the source and drain regions; and
   a metal silicide layer in the contact trenches on the source and drain regions, wherein the metal silicide layer has a homogenous phosphorous concentration that is greater than about $1.5 \times 10^{21}$ at./cm$^3$, and wherein the metal silicide layer is present entirely within the contact trenches and is below a top of the at least one gate stack.

10. The device of claim 9, wherein the phosphorous concentration is from about $4 \times 10^{21}$ at./cm$^3$ to about $1 \times 10^{22}$ at./cm$^3$, and ranges therebetween.

11. The device of claim 9, further comprising:
    a metal liner lining the contact trenches, wherein the metal liner is in direct contact with both the dielectric and the spacers.

12. The device of claim 11, wherein the metal liner comprises:
    a titanium layer on the metal silicide layer, wherein the titanium layer is present only at a bottom of the contact trenches; and
    a titanium nitride layer on the titanium layer, wherein the titanium nitride layer is present at the bottom and along sidewalls of the contact trenches.

13. The device of claim 11, further comprising:
    a gap fill metal over the metal liner filling the contact trenches.

14. The device of claim 13, wherein the gap fill metal comprises a metal selected from the group consisting of tungsten, cobalt, and combinations thereof.

15. The device of claim 9, wherein the metal silicide layer comprises titanium (Ti).

16. The device of claim 15, wherein the metal silicide layer has a formula $TiSi_x$.

17. A device comprising:
    an n-type transistor on a substrate, the transistor comprising at least one gate stack, source and drain regions on opposite sides of the at least one gate stack, and spacers in continuous and direct physical contact with a top and opposing sidewalls of the at least one gate stack;
    a dielectric over the transistor, wherein the dielectric extends horizontally over the at least one gate stack and the spacers, and wherein the dielectric is present alongside and under a bottom of at least one of the spacers;
    contact trenches in the dielectric that extend down to the source and drain regions;
    a metal silicide layer in the contact trenches on the source and drain regions, wherein the metal silicide layer has a homogenous phosphorous concentration that is greater than about $1.5 \times 10^{21}$ at./cm$^3$, and wherein the metal silicide layer is present entirely within the contact trenches and is below a top of the at least one gate stack;

a metal liner lining the contact trenches, wherein the metal liner is in direct contact with both the dielectric and the spacers; and a gap fill metal over the metal liner filling the contact trenches.

18. The device of claim 17, wherein the phosphorous concentration is from about $4 \times 10^{21}$ at./cm$^3$ to about $1 \times 10^{22}$ at./cm$^3$, and ranges therebetween.

19. The device of claim 17, wherein the metal liner comprises:

a titanium layer on the metal silicide layer, wherein the titanium layer is present only at a bottom of the contact trenches; and a titanium nitride layer on the titanium layer, wherein the titanium nitride layer is present at the bottom and along sidewalls of the contact trenches.

20. The device of claim 17, wherein the gap fill metal comprises a metal selected from the group consisting of tungsten, cobalt, and combinations thereof.

\* \* \* \* \*